(12) United States Patent
Carlson et al.

(10) Patent No.: US 9,111,980 B2
(45) Date of Patent: Aug. 18, 2015

(54) GAS EXHAUST FOR HIGH VOLUME, LOW COST SYSTEM FOR EPITAXIAL SILICON DEPOSITION

(71) Applicant: APPLIED MATERIALS, INC., Santa Clara, CA (US)

(72) Inventors: David K. Carlson, San Jose, CA (US); Michael R. Rice, Pleasanton, CA (US); Kartik B. Shah, Sunnyvale, CA (US); Kashif Maqsood, San Francisco, CA (US); Pravin K. Narwankar, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 120 days.

(21) Appl. No.: 13/721,311

(22) Filed: Dec. 20, 2012

(65) Prior Publication Data

US 2014/0060433 A1    Mar. 6, 2014

Related U.S. Application Data

(60) Provisional application No. 61/696,778, filed on Sep. 4, 2012, provisional application No. 61/711,493, filed on Oct. 9, 2012.

(51) Int. Cl.
*C23C 16/00* (2006.01)
*H01L 21/683* (2006.01)
*B05B 1/00* (2006.01)
*C30B 25/14* (2006.01)
(Continued)

(52) U.S. Cl.
CPC .............. *H01L 21/683* (2013.01); *B05B 1/005* (2013.01); *C30B 25/08* (2013.01); *C30B 25/14* (2013.01); *C30B 29/06* (2013.01); *E05F 1/00* (2013.01); *H01L 21/67017* (2013.01); *H01L 21/67028* (2013.01); *H01L 21/6776* (2013.01); *H01L 21/67115* (2013.01); *H01L 21/67173* (2013.01); *H01L 21/67712* (2013.01)

(58) Field of Classification Search
CPC ............ H01L 21/67028; H01L 21/677; H01L 21/67703; H01L 21/6734; H01L 21/67787; H01L 21/67155; C23C 16/45521; C23C 16/4412; C23C 16/4401
See application file for complete search history.

(56) References Cited

U.S. PATENT DOCUMENTS 5,147,168 A * 9/1992 Suwa et al. ................... 414/217
6,262,393 B1 * 7/2001 Imai et al. ..................... 219/390
(Continued)

FOREIGN PATENT DOCUMENTS

JP    2008-303452 A    12/2008

OTHER PUBLICATIONS

International Search Report and Written Opinion mailed Jan. 29, 2014 for PCT Application No. PCT/US2013/055796.

*Primary Examiner* — Gordon R Baldwin
*Assistant Examiner* — Charlee Bennett
(74) *Attorney, Agent, or Firm* — Moser Taboada; Len Linardakis

(57) ABSTRACT

Apparatus for the removal of exhaust gases are provided herein. In some embodiments, an apparatus may include a carrier for supporting one or more substrates in a substrate processing tool, the carrier having a first exhaust outlet, and an exhaust assembly including a first inlet disposed proximate the carrier to receive process exhaust from the first exhaust outlet of the carrier, a second inlet to receive a cleaning gas, and an outlet to remove the process exhaust and the cleaning gas.

20 Claims, 9 Drawing Sheets

(51) Int. Cl.
*C30B 25/08* (2006.01)
*E05F 1/00* (2006.01)
*H01L 21/67* (2006.01)
*H01L 21/677* (2006.01)
*C30B 29/06* (2006.01)

(56) References Cited

U.S. PATENT DOCUMENTS

| | | |
|---|---|---|
| 6,450,117 B1 | 9/2002 | Murugesh et al. |
| 6,612,590 B2 * | 9/2003 | Coomer et al. ............... 279/158 |
| RE42,830 E | 10/2011 | Matsushita et al. |
| 2004/0250775 A1 | 12/2004 | Sakai et al. |
| 2007/0256785 A1 | 11/2007 | Pamarthy et al. |
| 2008/0047578 A1 | 2/2008 | Yoo et al. |
| 2010/0065111 A1 | 3/2010 | Fu et al. |
| 2010/0092697 A1 | 4/2010 | Poppe et al. |
| 2010/0108134 A1 | 5/2010 | Ravi |
| 2010/0215872 A1 | 8/2010 | Sivaramakrishnan et al. |
| 2010/0263587 A1 | 10/2010 | Sivaramakrishnan et al. |
| 2011/0277688 A1 | 11/2011 | Trujillo et al. |
| 2011/0277690 A1 | 11/2011 | Rozenzon et al. |
| 2011/0283941 A1 | 11/2011 | Rozenzon et al. |
| 2011/0315186 A1 | 12/2011 | Gee et al. |
| 2012/0000511 A1 | 1/2012 | Gee et al. |
| 2013/0276702 A1 * | 10/2013 | CARLSON, David K. .. 118/723 I |
| 2014/0060434 A1 * | 3/2014 | CARLSON et al. .......... 118/728 |
| 2014/0060435 A1 * | 3/2014 | CARLSON et al. .......... 118/733 |

* cited by examiner

US 9,111,980 B2

GAS EXHAUST FOR HIGH VOLUME, LOW COST SYSTEM FOR EPITAXIAL SILICON DEPOSITION

CROSS-REFERENCE TO RELATED APPLICATIONS

This application claims benefit of U.S. provisional patent application Ser. No. 61/696,778, filed Sep. 4, 2012, and of U.S. provisional patent application Ser. No. 61/711,493, filed Oct. 9, 2012, both of which are herein incorporated by reference in their entirety.

FIELD

Embodiments of the present invention generally relate to semiconductor processing equipment, and more specifically, to a substrate carrier and gas exhaust for use in equipment and techniques for solar cell manufacturing, such as high efficiency single crystal epitaxial film deposition equipment.

BACKGROUND

Amorphous and polycrystalline solar cells are limited in their efficiency to convert light into energy. Single crystal high mobility materials are capable of much higher efficiency, but are typically much more expensive. Conventional equipment is designed for semiconductor applications with extreme requirements and with a very high cost involved. However, these systems all have high cost and are not capable of high throughput automation.

To achieve very low cost epitaxial deposition for photovoltaic applications at high throughput, the inventors believe that a radical change is required rather than simply making everything larger. For example, the inventors have observed that batch reactors are limited in throughput with high cost of materials, consumables, and automation challenges. Very high flow rates of hydrogen, nitrogen, water, and precursors are also required. Furthermore, a large amount of hazardous byproducts are generated when growing thick films.

Continuous reactors have been attempted many times for epitaxial processes but have never been production worthy nor achieved good precursor usage. The major issue is poor film quality and excessive maintenance.

On the other hand, single wafer reactors have very inefficient utilization of precursors and power (electrical) and have lower per wafer throughput. Plus single wafer reactors need complex substrate lift/rotation mechanisms. Thus, although single wafer reactors can have very high quality, low metal contamination levels, and good thickness uniformity and resistivity, the cost per wafer is very high to get these results.

Therefore, the inventors have provided embodiments of a substrate processing tool that may provide some or all of high precursor utilization, simple automation, low cost, and a relatively simple reactor design having high throughput and process quality.

SUMMARY

Apparatus for the removal of exhaust gases are provided herein. In some embodiments, an apparatus may include a carrier for supporting one or more substrates in a substrate processing tool, the carrier having a first exhaust outlet, and an exhaust assembly including a first inlet disposed proximate the carrier to receive process exhaust from the first exhaust outlet of the carrier, a second inlet to receive a cleaning gas, and an outlet to remove the process exhaust and the cleaning gas.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
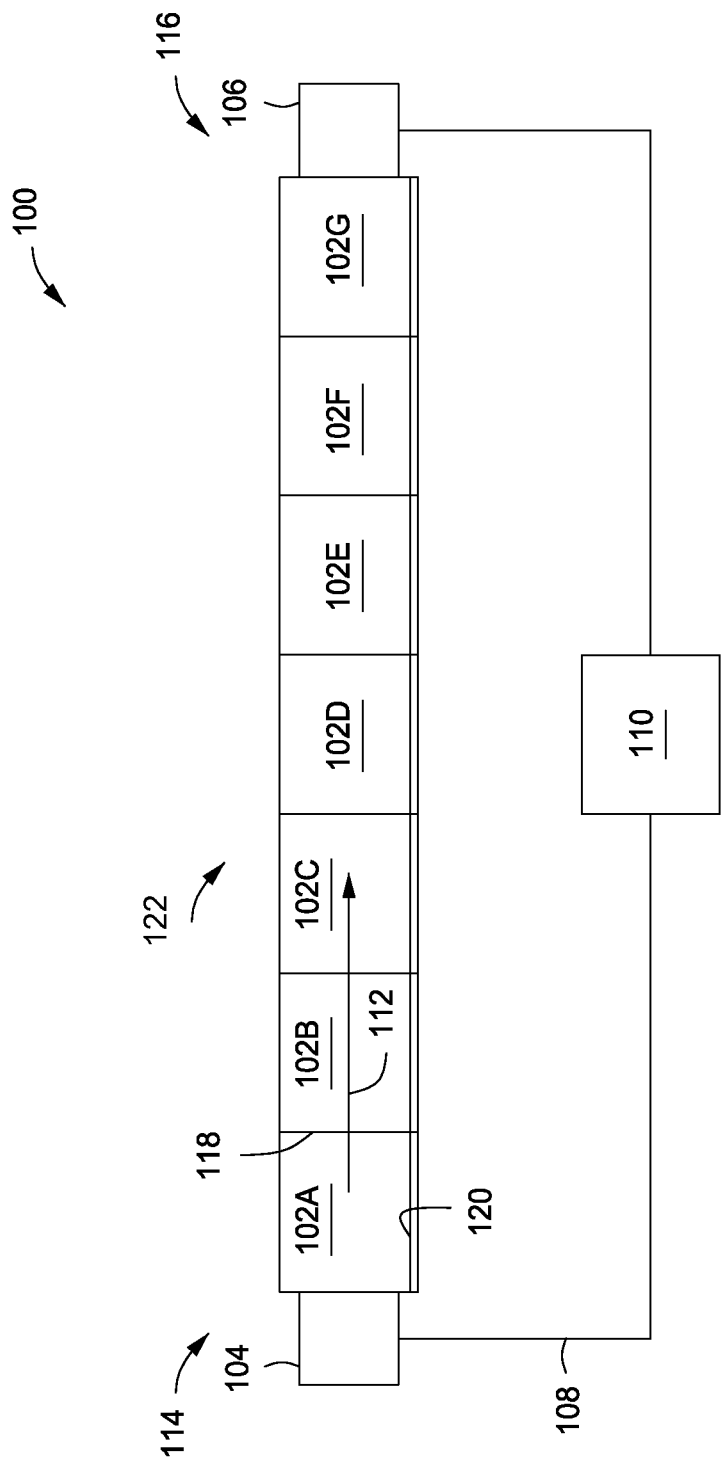
FIG. 1 depicts an indexed inline substrate processing tool in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of a high volume, low cost system for epitaxial silicon deposition are provided herein. While not limiting in scope, the inventors believe that the inventive substrate processing system may be particularly advantageous for solar cell fabrication applications.

The inventive system may advantageously provide cost effective and simple manufacturability and an energy and cost efficient usage, as compared to conventional substrate processing tools utilized to perform multi-step substrate processes.

For example, basic design components are based on flat plates to simplify manufacturing and contain cost by using readily available materials in standard forms to keep cost down. High reliability linear lamps can be used. The specific lamps can be optimized for the specific application. The lamps may be of the type typically used in epitaxial deposition reactors. Flow fields within the system can also be optimized for each specific application to minimize waste. The design minimizes purge gas requirements and maximizes precursor utilization. Cleaning gas may be added to an exhaust system to facilitate removal of deposited material from the exhaust channels. Load and unload automation can also be separated to facilitate inline processing. Complex automation can be handled offline. Substrates are pre-loaded on carriers (susceptors) for maximum system flexibility, thereby facilitating integration to other steps. The system provides for flexibility of the system configuration. For example, multiple deposition chambers (or stations) can be incorporated for multilayer structures or higher throughput.

Embodiments of a high volume, low cost system for epitaxial silicon deposition may be performed using a standalone substrate processing tool, a cluster substrate processing tool or an indexed inline substrate processing tool. FIG. 1 is an indexed inline substrate processing tool 100 in accordance with some embodiments of the present invention. The indexed inline substrate processing tool 100 may generally be configured to perform any process on a substrate for a desired semiconductor application. For example, in some embodiments, the indexed inline substrate processing tool 100 may be configured to perform one or more deposition processes, for example, such as an epitaxial deposition process.

The indexed inline substrate processing tool 100 generally comprises a plurality of modules 112 (first module 102A, second module 102B, third module 102C, fourth module 102D, fifth module 102E, sixth module 102F, and seventh module 102G shown) coupled together in a linear arrangement. A substrate may move through the indexed inline substrate processing tool 100 as indicated by the arrow 122. In some embodiments, one or more substrates may be disposed on a substrate carrier, for example, such as the substrate carriers 502, 602 and 702 described below with respect to FIGS. 5-8, to facilitate movement of the one or more substrates through the indexed inline substrate processing tool 100.

Each of the plurality of modules 112 may be individually configured to perform a portion of a desired process. By utilizing each of the modules to perform only a portion of a desired process, each module of the plurality of modules 112 may be specifically configured and/or optimized to operate in a most efficient manner with respect to that portion of the process, thereby making the indexed inline substrate processing tool 100 more efficient as compared to conventionally used tools utilized to perform multi-step processes.

In addition, by performing a portion of a desired process in each module, process resources (e.g., electrical power, process gases, or the like) provided to each module may be determined by the amount of the process resource required only to complete the portion of the process that the module is configured to complete, thereby further making the inventive indexed inline substrate processing tool 100 more efficient as compared to conventionally used tools utilized to perform multi-step processes.

Furthermore, separate modules advantageously allow for depositing layers of differing dopants on one or more substrates: for example, 10 microns of p++ dopants; 10 microns of p+ dopants; 10 microns of n dopants. Meanwhile, conventional single chambers prohibit deposition of different dopants since they interfere with each other. In addition, inline linear deposition where an epitaxial layer is built up in separate chambers helps to prevent overgrowth or bridging of the epitaxial Silicon (Si) from the substrate over the carrier due to use of a purge gas between modules (discussed below), providing an etch effect during the transfer stage from one module to the next.

In an exemplary configuration of the indexed inline substrate processing tool 100, in some embodiments, the first module 102A may be configured to provide a purge gas to, for example, remove impurities from the substrate and/or substrate carrier and/or introduce the substrate into a suitable atmosphere for deposition. The second module 102B may be configured to preheat or perform a temperature ramp to raise a temperature of the substrate to a temperature suitable for performing the deposition. The third module 102C may be configured to perform a bake to remove volatile impurities from the substrate prior to the deposition of the materials. The fourth module 102D may be configured to deposit a desired material on the substrate. The fifth module 102E may be configured to perform a post-deposition process, for example such as an annealing process. The sixth module 102F may be configured to cool the substrate. The seventh module 102G may be configured to provide a purge gas to, for example, remove process residues from the substrate and/or substrate carrier prior to removal from the indexed inline substrate processing tool 100. In embodiments where certain processes are not needed, the module configured for that portion of the process may be omitted. For example, if no anneal is needed after deposition, the module configured for annealing (e.g., the fifth module 102E in the exemplary embodiment above) may be may be omitted or may be replaced with a module configured for a different desired process.

Some embodiments of substrate processing tool 100 include an inline "pushing mechanism" (now shown) or other mechanism that is able to serially transfer the abutting substrate carriers through modules 102A-102G. For example, indexed transport can use a pneumatic plunger-type push mechanism to drive carrier modules forward through the in-line reactor.

Some or all of the plurality of modules may be isolated or shielded from adjacent modules, for example by a barrier 118, to facilitate maintaining an isolated processing volume with respect to other modules in the indexed inline substrate processing tool 100. For example, in some embodiments, the barrier 118 may be a gas curtain, such as of air or of an inert gas, provided between adjacent modules to isolate or substantially isolate the modules from each other. In some embodiments, gas curtains can be provided along all four vertical walls of each module, or of desired modules (such as deposition or doping modules), to limit unwanted cross-contamination or deposition in undesired locations of the module or carriers. Such isolation also prevents contaminants such as carbon or moisture from reaching the reaction zone/substrates.

In some embodiments, the barrier 118 may be a gate or door that can open to allow the substrate carrier to move from one module to the next, and can be closed to isolate the module. In some embodiments, the indexed inline substrate processing tool 100 may include both gas curtains and gates, for example, using gas curtains to separate some modules and gates to separate other modules, and/or using gas curtains and gates to separate some modules. Once the push mechanism delivers the substrate carriers to a desired position in each chamber, a door/gate assembly (and chamber liner elements) forms a seal around the substrate carrier to form an enclosed region within each chamber. As the door mechanism is opening or closing a gas flow (i.e., gas purge, or gas curtain) is provided between each door and its adjacent carriers to prevent cross-contamination between chambers. The provided gas flow is received by one or more exhaust ports that are disposed in the bottom of the processing tool 100.

In some embodiments, isolation is provided by purge gas curtains using nitrogen or argon gas depending on the location of the gas curtain. For example, the gas curtain in the hotter processing regions would be formed using argon gas. The gas curtains in colder regions near the gates, away from the hotter processing regions, could by nitrogen to minimize cost of operation. The nitrogen gas curtains can only be used in cold, inert sections of each module.

In some embodiments, a load module 104 may be disposed at a first end 114 of the indexed inline substrate processing tool 100 and an unload module 106 may be disposed at a second end 116 of the indexed inline substrate processing tool 100. When present, the load module 104 and unload module 106 may facilitate providing a substrate to, and removing a substrate from, the indexed inline substrate processing tool 100, respectively. In some embodiments, the load module 104 and the unload module 106 may provide vacuum pump down and back to atmospheric pressure functions to facilitate transfer of substrates from atmospheric conditions outside of the indexed inline substrate processing tool 100 to conditions within the indexed inline substrate processing tool 100 (which may include vacuum pressures). In some embodiments, one or more substrate carrier transfer robots may be utilized to provide and remove the substrate carrier from the load module 104 and the unload module 106, thereby providing an automated loading and unloading of the substrate carrier to and from the indexed inline substrate processing tool 100.

In some embodiments, a track 120 may be provided along the axial length of the indexed inline substrate processing tool 100 to facilitate guiding the substrate carrier through the indexed inline substrate processing tool 100. The track 120 may be provided along a floor of a facility or other base surface upon which the indexed inline substrate processing tool 100 is mounted. In such embodiments, each module may be configured to be assembled such that the track 120 may be positioned along an exposed bottom portion of the module to facilitate moving the substrate carrier along the track 120 and through each respective module. Alternatively, the track 120 may be mounted to a bottom surface of the modules once assembled in a linear array. Alternatively, portions of the track 120 may be mounted to a bottom surface of each individual module such that the complete track 120 is formed after assembly of all of the modules in a linear array. In some embodiments, the track 120 may include wheels, ball bearings or other types of rollers to facilitate low friction movement of the substrate carrier along the track 120. In some embodiments, the track 120 may be fabricated from or may be coated with a low friction material, such as described below with respect to FIG. 2, to facilitate low friction movement of the substrate carrier along the track 120.

In some embodiments, a cleaning module 110 may be disposed between the load module 104 and the unload module 106. When present, the cleaning module 110 may clean and/or prepare the substrate carrier to receive another one or more substrates for a subsequent run through the indexed inline substrate processing tool 100 (as indicated by the return path arrow 108). As such, the substrate carriers may be re-used multiple times.

Figure 2:
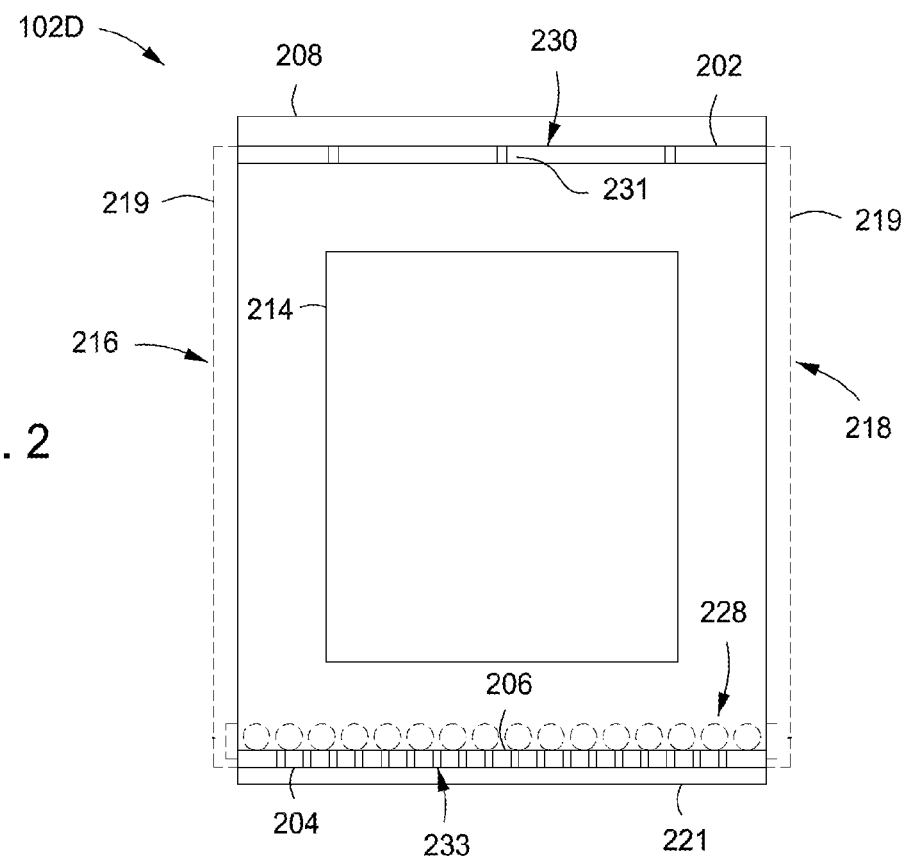
FIG. 2 is a cross sectional view of a module of a substrate processing tool in accordance with some embodiments of the present invention.

FIG. 2 depicts a cross sectional view of an exemplary configuration of a module, such as module 102D, that may be used as one or more of the modules of the plurality of modules 112 described above, and in some embodiments, as a module configured for the deposition of materials on a substrate. Although generally discussed below in terms of a specific module (102E), the below discussion generally applies to all modules with the exception of components and/or configurations only specifically required for a deposition process.

Referring to FIG. 2, in some embodiments, the module 102D generally comprises an enclosure 202. The enclosure 202 may be fabricated from any material suitable for semiconductor processing, for example, a metal such as aluminum, stainless steel, or the like. The enclosure 202 may have any dimensions suitable to accommodate a substrate carrier (e.g., substrate carrier 502 described below) configured to carry one or more substrates of a given size as well as to facilitate a desired flow rate and profile. For example in some embodiments, the enclosure may have a height and length of about 24 inches or about 36 inches and a depth of about 6 inches.

In some embodiments, the enclosure 202 may be assembled by coupling a plurality of plates together to form the enclosure 202. Each enclosure 202 may be configured to form a particular module (e.g., module 102D) that is capable of performing a desired portion of a process. By assembling the enclosure 202 in such a manner, the enclosure 202 may be produced in multiple quantities for multiple applications via a simple and cost effective process.

A lower surface 206 of the enclosure supports the substrate carrier and provides a path for the substrate carrier to move linearly through the module 102D to an adjacent module of the plurality of modules. In some embodiments, the lower surface 206 may be configured as the track 120. In some embodiments, the lower surface 206 may have the track 120, or a portion thereof, coupled to the lower surface 206. In some embodiments, the lower surface 206, or the track 120, may comprise a coating, for example, a dry lubricant such as a nickel alloy (NiAl) containing coating, to facilitate movement of the substrate carrier through the module 102D. Alternatively, or in combination, in some embodiments, a plurality of rollers (shown in phantom at 228) may be disposed above the lower surface 206 to facilitate movement of the substrate carrier through the module 102D. In such embodiments, the plurality of rollers 228 may be fabricated from any material that is non-reactive to the process environment, for example, such as quartz ($SiO_2$).

In some embodiments, a barrier 219 may be disposed proximate the first end 216 and/or second end 218 of the enclosure 202 (e.g., to form the barrier 118 as shown in FIG. 1). When present, the barrier 219 isolates each module of the plurality of modules from an adjacent module to prevent cross contamination or mixing of environments between modules. In some embodiments, the barrier 219 may be a stream of gas, for example a purge gas, provided by a gas inlet (e.g., such as the gas inlet 208) disposed above the module 102D. Alternatively, or in combination, in some embodiments, the barrier 219 may be a movable gate. The gate provides additional isolation for certain processes, for example, during the deposition part of the sequence.

In some embodiments, the gate may be fabricated from a metal, such as aluminum, polished stainless steel, or the like.

In other embodiments, the gates in hotter regions of the processing system can be made out of quartz to withstand the high temperatures.

In some embodiments, the module 102D may comprise one or more windows disposed in one or more sides of the enclosure, for example such, as the window 214 disposed in the side 220 of the enclosure 202, as shown in FIG. 2. When present, the window 214 allows radiant heat to be provided into the enclosure 202 from, for example, a radiant heat lamp disposed on a side of the window 214 opposite the interior of the enclosure 202. The window 214 may be fabricated from any material suitable to allow the passage of radiant heat through the window 214 while resisting degradation when exposed to the processing environment within the enclosure 202. For example, in some embodiments, the window 214 may be fabricated from quartz ($SiO_2$).

In some embodiments, the module 102D may include a gas inlet 208 disposed proximate a top 230 of the enclosure 202 to provide one or more gases into the enclosure 202 via through holes 231 formed in the enclosure 202. The gas inlet 208 may be configured in any manner suitable to provide a desired process gas flow to the enclosure 202. Gas injection may be provided between the two substrate carriers to contain the process gases in the reaction zone between the two substrate carriers, and/or purge gases between the substrate carriers and the module walls.

Figure 4:
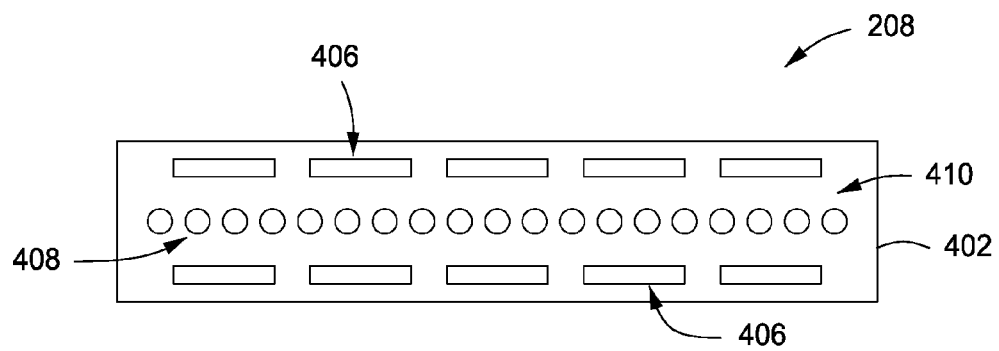
FIG. 4 is a schematic top view of a gas inlet in accordance with some embodiments of the present invention.

For example, referring to FIG. 4, in some embodiments, the gas inlet 208 may comprise a gas distribution plate 402 having a plurality of gas orifices 410. The gas orifices 410 may be configured to provide a desired flow of process gases into the enclosure 202. For example, in some embodiments, the gas orifices 410 may comprise a plurality of inner gas holes 408 and a plurality of outer gas slots 406, such as shown in FIGS. 4. In such embodiments, the inner gas holes 408 may provide a high velocity jet flow of process gases to a central area of the enclosure 202 to facilitate a process. In some embodiments, outer gas slots 406 may provide a lower velocity laminar flow of process gases over substrates disposed in the substrate carriers.

Referring back to FIG. 2, in some embodiments, the module 102D may comprise an exhaust 221 coupled to a portion of the enclosure 202 opposite the gas inlet 208 (e.g. the bottom 204) to facilitate the removal of gases from the enclosure 202 via passageways 233 formed in the bottom 204 of the enclosure 202.

Figure 3:
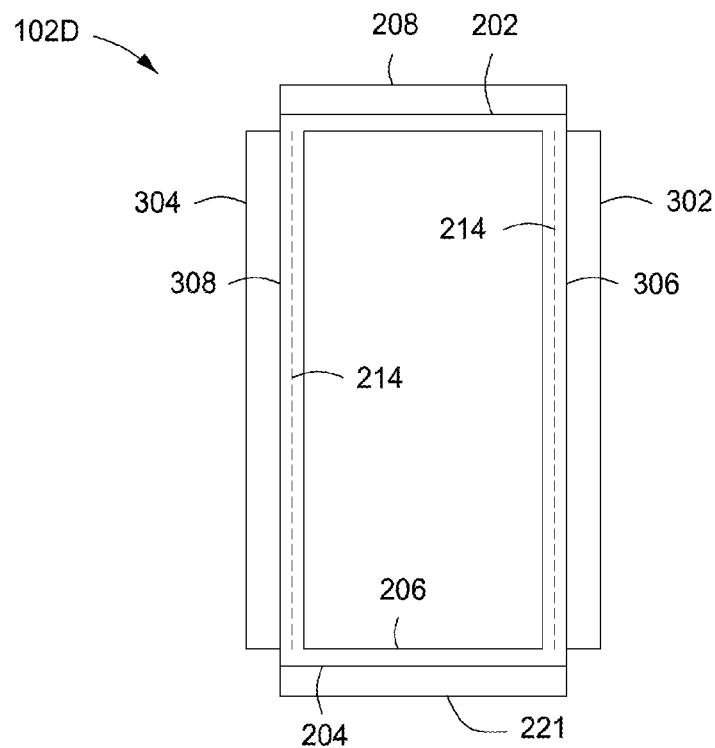
FIG. 3 is a module of a substrate processing tool in accordance with some embodiments of the present invention.

Referring to FIG. 3, in some embodiments, the module 102D may include one or more heating lamps (two heating lamps 302, 304 shown) coupled to the sides 306, 308 of the enclosure 202. The heating lamps 302, 304 provide radiant heat into to enclosure 202 via the windows 214. The heating lamps 302, 304 may be any type of heating lamp suitable to provide sufficient radiant heat into the enclosure to perform a desired portion of a process within the module 102D. For example, in some embodiments, the heating lamps 302, 304 may be linear lamps or zoned linear lamps capable of providing radiant heat at a wavelength of about 0.9 microns, or in some embodiments, about 2 microns. The wavelengths used for lamps in various modules may be selected based upon the desired application. For example, the wavelength may be selected to provide a desired filament temperature. Low wavelength bulbs are less expensive, use less power, and can be used for preheating. Longer wavelength bulbs provide high power to facilitate providing higher process temperatures, for example, for deposition processes.

In some embodiments, Infrared (IR) lamps may be provided in one or more zones to provide heat energy to the substrate carriers and ultimately to the substrates. Portions of the chamber where no deposition is desired, such as the windows, may be fabricated of materials that will not absorb IR light energy and heat up. Such thermal management keeps deposition substantially contained to desired areas. The one or more zones of IR lamps, for example in horizontal bands from top to bottom of sides of the module, facilitate controlling vertical temperature gradients to compensate for depletion effects or other vertical non-uniformities of deposition or other processing. In some embodiments, temperature can also be modulated over time as well as between zones. This type of granular temperature control, in addition to the gas injection modulation described above with respect to FIG. 4, or combinations thereof, can facilitate control of substrate processing results from top to bottom of the substrates as well as lateral edge to edge (for example, a thickness of a deposited film or uniformity of dopant concentration and/or depth).

Figure 5:
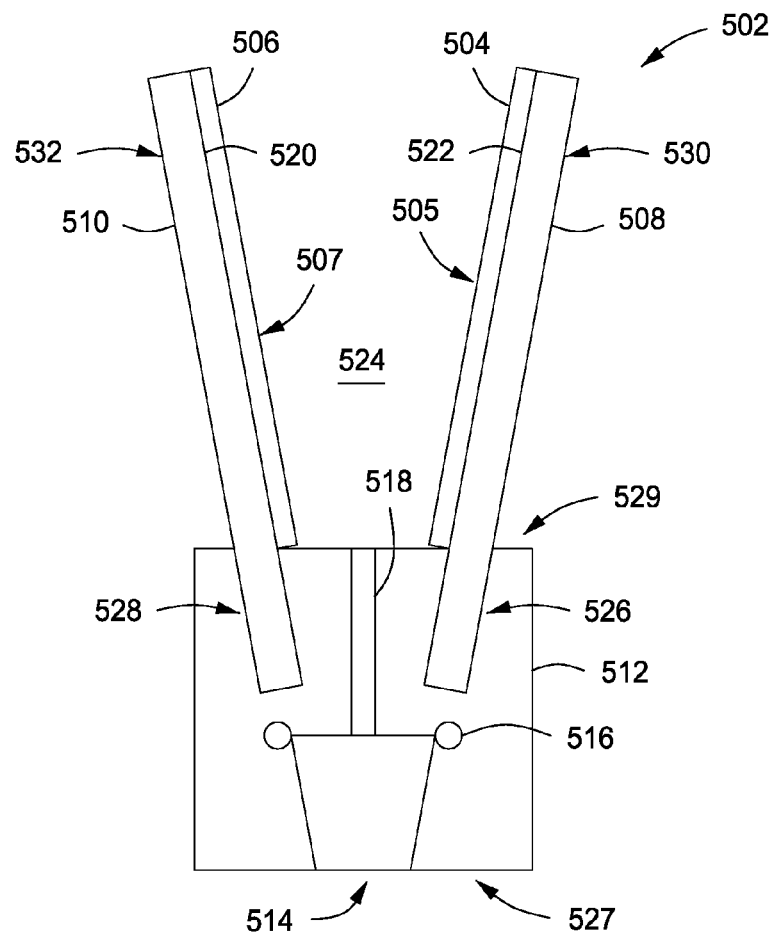
FIG. 5 is a substrate carrier for use in a substrate processing tool in accordance with some embodiments of the present invention.

FIG. 5 depicts at least one exemplary embodiment of a substrate carrier 502 that may be used with embodiments of the present invention described herein. The substrate carrier 502 may support two or more substrates and carry the two or more substrates through the indexed inline substrate processing tool 100 or to a cluster substrate processing tool (not shown). In some embodiments, the substrate carrier 502 may generally include a base 512 and a pair of opposing substrate supports 508, 510. One or more substrates, (substrate 504, 506 shown in FIG. 5) may be disposed on each of the substrate supports 508, 510 for processing. In some embodiments, the substrate supports 508, 510 are secured on substrate carrier 502 and may be held at an acute angle with respect to each other, with the substrates facing each other and defining a reaction zone therebetween. For example, in some embodiments the substrate supports 508, 510 are held at an angle of about between 2 degrees and 10 degrees from vertical.

The base 512 may be fabricated from any material suitable to support the substrate supports 508, 510 during processing, for example such as graphite. In some embodiments, a first slot 526 and a second slot 528 may be formed in the base 512 to allow for the substrate supports 508, 510 to be at least partially disposed within the first slot 526 and second slot 528 to retain the substrate supports 508, 510 in a desired position for processing. In some embodiments, the substrate supports 508, 510 are generally slightly angled outwardly such that the substrate supporting surfaces generally oppose each other and are arranged in a "v" shape. In some embodiments, the base 512 is fabricated from an insulating material and may be either clear or opaque quartz or a combination of clear and opaque quartz for temperature management.

A channel 514 is disposed in a bottom surface 527 of the base 512 and an opening 518 is disposed through the base 512 from a top surface 529 of the base 512 to the channel 514 to form a path for one or more gases to flow through the base 512. For example, when the substrate carrier 502 is disposed in a module, such as the module 102D described above, the opening 518 and channel 514 facilitates a flow of gas from a gas inlet (e.g., gas inlet 208 described above) to an exhaust of the module (e.g., exhaust 221 of module 102D described above). The carrier may be fabricated from quartz with the exhaust and cleaning channels machined into the quartz or a metal base disposed below the quartz. A baffle may be provided to facilitate evening out the flow through the base 512.

In some embodiments, the base 512 may include a conduit 516 disposed within the base 512 and circumscribing the channel 514. The conduit 516 may have one or more openings formed along the length of the conduit 516 to fluidly couple the conduit 516 to the channel 514 to allow a flow of gas from the conduit 516 to the channel 514. In some embodiments, while the substrate carrier 502 is disposed in a module, a cleaning gas may be provided to the conduit 516 and channel 514 to facilitate removal of deposited material from the channel 514. The cleaning gases may be provided proximate one or more exhausts to prevent deposition of process byproducts within the exhaust, thereby reducing downtime necessary for cleaning//maintenance. The cleaning gas may be any gas suitable to remove a particular material from the module. For example, in some embodiments the cleaning gas may comprise one or more chlorine containing gases, such as hydrogen chloride (HCl), chlorine gas (Cl$_2$), or the like. Alternatively, in some embodiments, an inert gas may be provided to the conduit 516 and channel 514 to minimize deposition of material on the channel 514 by forming a barrier between the exhaust gases flowing through the channel and the surfaces of the channel.

The substrate supports 508, 510 may be fabricated from any material suitable to support a substrate 504, 506 during processing. For example, in some embodiments, the substrate supports 508, 510 may be fabricated from graphite. In such embodiments, the graphite may be coated, for example with silicon carbide (SiC), to provide resistance to degradation and/or to minimize substrate contamination.

The opposing substrate supports 508, 510 comprise respective substrate support surfaces 520, 522 that extend upwardly and outwardly from the base 512. Thus, when substrates 504, 506 are disposed on the substrate supports 508, 510, a top surface 505, 507 of each of the substrates 504, 506 face one another. Facing the substrates 504, 506 toward one another during processing advantageously creates a radiant cavity between the substrates (e.g. in the area 524 between the substrate supports 508, 510) that provides an equal and symmetrical amount of heat to both substrates 504, 506, thus promoting process uniformity between the substrates 504, 506.

In some embodiments, during processing, process gases are provided to the area 524 between the substrate supports 508, 510 while a heat source disposed proximate a back side 530, 532 of the substrate supports 508, 510 (e.g., the heating lamps 302, 304 described above) provides heat to the substrates 504, 506. Providing the process gases to the area 524 between the substrate supports 508, 510 advantageously reduces exposure of the process gases to interior components of the modules, thus reducing material deposition on cold spots within the modules (e.g., the walls of the modules, windows, or the like) as compared to conventional processing systems that provide process gases between a heat source and substrate support. In addition, the inventor has observed that by heating the substrates 504, 506 via the back side 530, 532 of the substrate supports 508, 510 any impurities within the module will deposit on the back side 530, 532 of the substrate supports 508, 510 and not the substrates 504, 506, thereby advantageously allowing for the deposition of materials having high purity and low particle count atop the substrates 504, 506.

In operation of the indexed inline substrate processing tool 100 as described in the above figures, the substrate carrier 502 having a first set of substrates disposed in the substrate carrier 502 (e.g. substrates 504, 506) is provided to a first module (e.g. first module 102A). When present, a barrier (e.g., barrier 118 or barrier 219) on the first side and/or the second side of the first module may be closed or turned on to facilitate isolating the first module. A first portion of a process (e.g., a purge step of a deposition process) may then be performed on the first set of substrates. After the first portion of the process is complete, a second substrate carrier having a second set of substrates disposed in a second substrate carrier is provided to the first module. As the second substrate carrier is provided to the first module, the second substrate carrier pushes the first carrier to the second module (e.g., the second module 102B). The first portion of the process is then performed on the second set of substrates in the first module while a second portion of the process is performed on the first set of substrates in the second module. The addition of subsequent substrate carriers repeats to provide each substrate carrier to a fixed position (i.e., within a desired module), thus providing a mechanical indexing of the substrate carriers. As the process is completed, the substrate carriers may be removed from the indexed inline substrate processing tool 100 via an unload module (e.g., unload module 106).

Figure 6A:
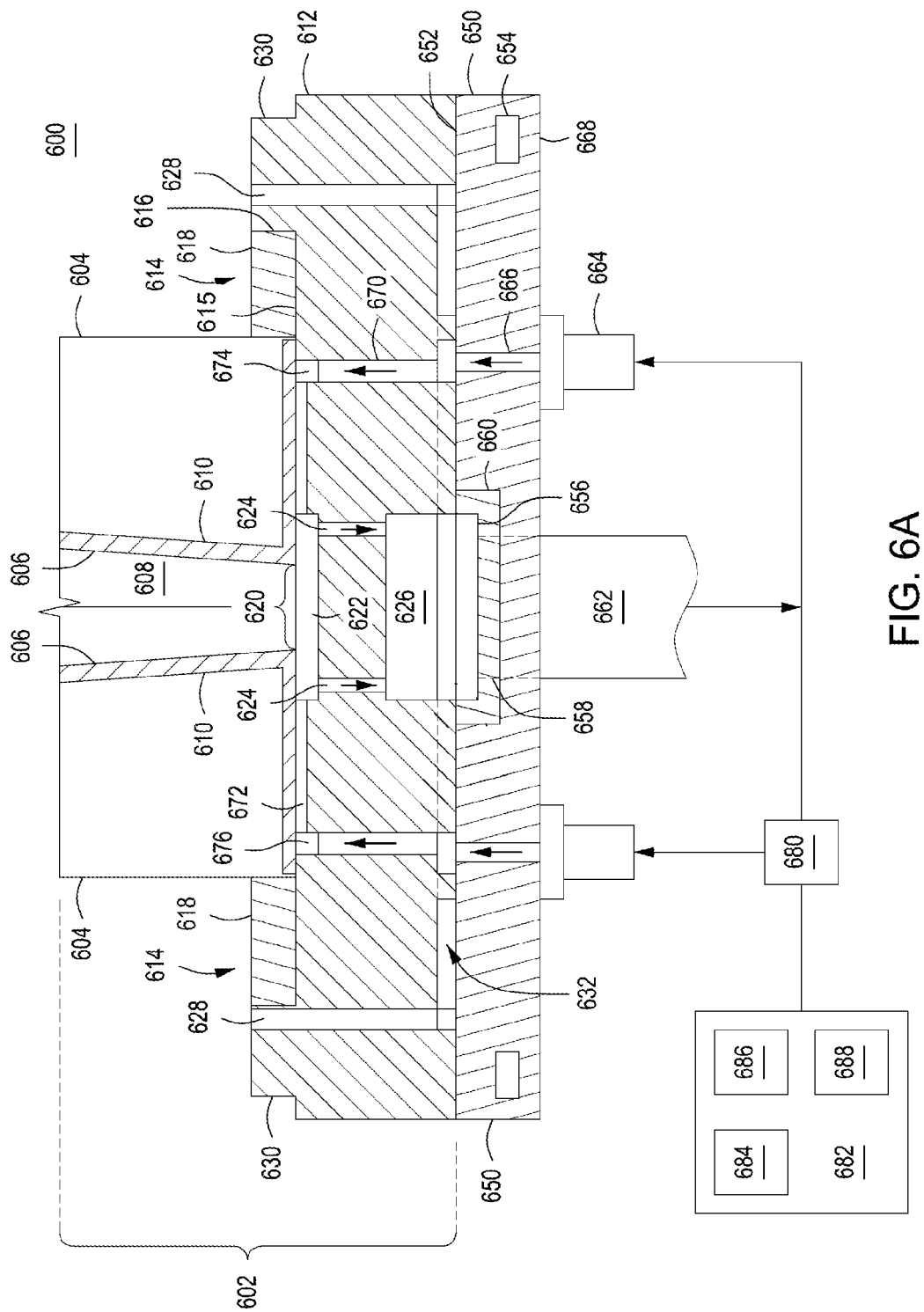
FIG. 6A is a schematic end view of a substrate carrier and exhaust system for use in a substrate processing tool in accordance with some embodiments of the present invention.

FIG. 6A depicts at least one exemplary embodiment of an exhaust system 600 that may be used with embodiments of the present invention described herein. In FIG. 6A, a movable substrate carrier 602 may be movably disposed on a base plate 650 (e.g., track 120 discussed above with respect to FIG. 1) to facilitate movement of one or more substrates through the indexed inline substrate processing tool 100 described in FIG. 1, or in and out of a standalone, inline, or cluster substrate processing tool. In some embodiments, the top surface 652 of base plate 650, may comprise a coating, for example, a dry lubricant and/or wear enhancing material such as a nickel alloy (NiAl) containing coating, or dry lubricant, to facilitate movement of the substrate carrier through, or into and out of, a processing tool. Alternatively, or in combination, in some embodiments, a plurality of rollers, wheels, low contact area bearing surfaces/features may be disposed between substrate carrier 602 and base plate 650 to facilitate movement of the substrate carrier through, or into and out of, a processing tool.

In some embodiments, the movable substrate carrier 602 may include a pair of substrate support plates 604 facing each other in a predominantly vertical orientation. The substrate support plates 604 may be coupled together (e.g., using fasteners or secured together via posts) directly, or coupled to the movable substrate carrier 602. In some embodiments, each substrate support plate 604 includes a substrate support surface 606 that extends upwardly and outwardly from a bottom portion of the substrate support plates 604, such that when the substrate support plates 604 are mounted on the movable substrate carrier 602, the substrate support surfaces 606 form a "V" pattern as shown in FIG. 6A. The substrate support surfaces 606 include one or more pockets to support one or more substrates when disposed thereon. Thus, when substrates are disposed on substrate support surfaces 606, top surfaces to be processed for each of the substrates face one another. Facing the substrates toward one another during processing advantageously creates a radiant cavity between the substrates (e.g. in the area 608 between the substrate support surfaces 606) that provides an equal and symmetrical amount of heat to substrates, thus promoting process uniformity between the substrates. In some embodiments, the substrate supports surfaces 606 are held at an angle of about between 2 degrees and 10 degrees from vertical. In some embodiments, when support plates 604 are coupled together, the sides of the support plates 604 substantially form a seal to restrain process gases from escaping from the sides of the support plates 604. In addition, when support plates 604 are placed together, a bottom exhaust slot 620 is formed along a bottom portion of the support plates 604 to facilitate the exhaust of substrate processing gases.

In some embodiments, as described with respect to the substrate carrier 502 of FIG. 5, process gases are provided to the area 608 between the substrate support surfaces 606 while a heat source disposed proximate a back side 610 of the substrate support surfaces 606 (e.g., the heating lamps 302, 304 described above) provides heat to substrates disposed on substrate support surfaces 606.

The movable substrate carrier 602 includes a transport base 612. In some embodiments, the substrate support plates 604 are disposed on a top surface 615 of a pocket 614 in transport base 612. The substrate support plates 604 may be restrained on transport base 612, for example, using fasteners or using support posts disposed on transport base 612. In some embodiments, spacers 618 may be used with substrate support plates 604 to help secure the substrate support plates 604 within an inner edge 616 of the transport base pocket 614. In some embodiments, if the substrate support plates 604 are sufficiently restrained on the transport base pocket 614, no additional fasteners may be required. In some embodiments, the spacers 618 may be fabricated from opaque quartz to block radiation and to provide insulation. In other embodiments, a clear quartz may be used to insulate without absorbing radiation.

The transport base 612 includes one or more exhaust ports and a number of exhaust channels and conduits to facilitate the exhaust of one or more different types of gases. In some embodiments, a first gas channel 622 is formed on a top surface of transport base 612 along a centerline of transport base 612 and may be fluidly coupled to the bottom exhaust slot 620 formed between substrate support plates 604. The first gas channel 622 accepts exhaust gases via bottom exhaust slot 620 from the process gases injected (e.g., via gas inlet 208) between substrate support plates 604 to process substrates when disposed thereon. The exhaust gases received via bottom exhaust slot 620 may travel along the first gas channel 622 and exit the first gas channel 622 using one or more openings 624 formed along the length of the first gas channel 622. Each of the one or more openings 624 are fluidly coupled to a second gas channel 626 formed on a bottom surface of transport base 612 along a centerline of transport base 612. Thus, the one or more openings 624 are fluidly coupling the first gas channel 622 to the second gas channel 626.

In some embodiments, the transport base 612 includes one or more purge gas exhaust conduits 628 formed along the length of the transport base 612 and disposed proximate the outer edges 630 of the transport base 612 on either side of the substrate support plates 604. The purge gas exhaust conduits 628 receive and exhaust the purge gases injected via gas inlet 208 to form the purge gas curtain discussed above. Each of the one or more purge gas exhaust conduits 628 are fluidly coupled to a bottom pocket 632 formed on a bottom surface of transport base 612 and fluidly coupled to the second gas channel 626. Thus, the one or more purge gas exhaust conduits 628 are fluidly coupled to the second gas channel 626.

In some embodiments, the base plate 650 includes a center gas channel 656 formed on a top surface of base plate 650 along a centerline of base plate 650. The center gas channel 656 is fluidly coupled to one or more exhaust conduits 658 that extend from the top surface of base plate 650 to a bottom surface 668 of base plate 650. The center gas channel 656 fluidly couples with the second gas channel 626 on the transport base 612 to receive exhaust gases. The exhaust conduit 658 is fluidly coupled to a port 662 that receives the exhaust gases from the system 600.

In some embodiments, while the substrate carrier 602 is disposed in a process tool, a cleaning gas may be provided to the exhaust system to facilitate removal of deposited material from the exhaust system. Specifically with respect to the embodiments of FIG. 6A, one or more cleaning gases may be provided by cleaning gas supply ports 664 to one or more cleaning gas supply conduits 666 formed in the base plate 650. The cleaning gases prevent deposition of process byproducts within the exhaust, thereby reducing downtime necessary for cleaning/maintenance. The cleaning gas may be any gas suitable to remove a particular material from the module or to prevent deposition on the module components. For example, in some embodiments the cleaning gas may comprise one or more chlorine containing gases, such as hydrogen chloride (HCl), chlorine gas ($Cl_2$), or the like. Alternatively, in some embodiments, an inert gas may be provided to the cleaning gas supply conduit 666 to minimize deposition of material in any of the gas conduits (e.g., conduits, slots, openings and channels) described above, by forming a barrier between the exhaust gases flowing through the conduits and the surfaces of the conduits.

When the substrate carrier 602 is moved into position on base plate 650, the cleaning gas supply conduits 666 substantially align with one or more cleaning gas supply conduits 670 formed in transport base 612. The cleaning gas supply conduits 670 are fluidly coupled to a cleaning gas supply channel 676 via inlets 674. The cleaning gas supply channel 676 supplies cleaning gas to cleaning gas supply slots 672 (via) formed on a top portion of transport base 612. The cleaning gas supply slots 672 are fluidly coupled to the first gas channel on the top of transport base 612. Thus, the cleaning gas is exhausted via the same path as the process gases as described above (e.g., via opening 624, the second gas channel 626, the center gas channel 656, exhaust conduit 658 and exhaust port 662). In some embodiments, the cleaning gas supplied by cleaning gas supply ports 664 mixes with the process gas exhaust supplied by gas inlet 208. In other embodiments, only the cleaning gas is supplied to clean the exhaust conduits described above.

In some embodiments, the center gas channel 656 may include a liner 660 fabricated from an opaque quartz material. In some embodiments the base plate 650 may include one or more cooling channels 654 to facilitate heat removal. The one or more channels may be fluidly coupled to a coolant supply (not shown).

The components of exhaust system 600 described above may be fabricated from any material suitable to support a substrate processing. For example, in some embodiments, the substrate support plates 604, or support surfaces 606, may be fabricated from graphite. In such embodiments, the graphite may be coated, for example with silicon carbide (SiC), to provide resistance to degradation and/or to minimize substrate contamination. In some embodiments, any of the components described above may be fabricated from transparent or non-transparent quartz as desired based on heating or deposition profiles required for various processes.

In some embodiments, the cleaning gas supply ports 664 may be coupled to one or more mass flow controllers 680 to provide cleaning gas to the exhaust system 600. The mass flow controllers 680 may be coupled to a controller 682 to control the amount and concentration of the one or more cleaning gases supplied. The controller 682 includes a central processing unit (CPU) 684, a memory 686, and support circuits 688. The controller 682 may be one of any form of general-purpose computer processor that can be used in an industrial setting for controlling various substrate processing tools or components thereof. The memory, or computer readable medium, 686 of the controller 682 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 688 are coupled to the CPU 684 for supporting the processor in a conventional manner. These circuits include cache, power supplies, clock circuits, input/output circuitry and subsystems, and the like. Inventive methods as described herein may be stored in the memory 686 as software routine that may be executed or invoked to control the operation of the exhaust system 600 in the manner described herein. The software routine may also be stored and/or executed by a second CPU (not shown) that is remotely located from the hardware being controlled by the CPU 684.

Figure 6B:
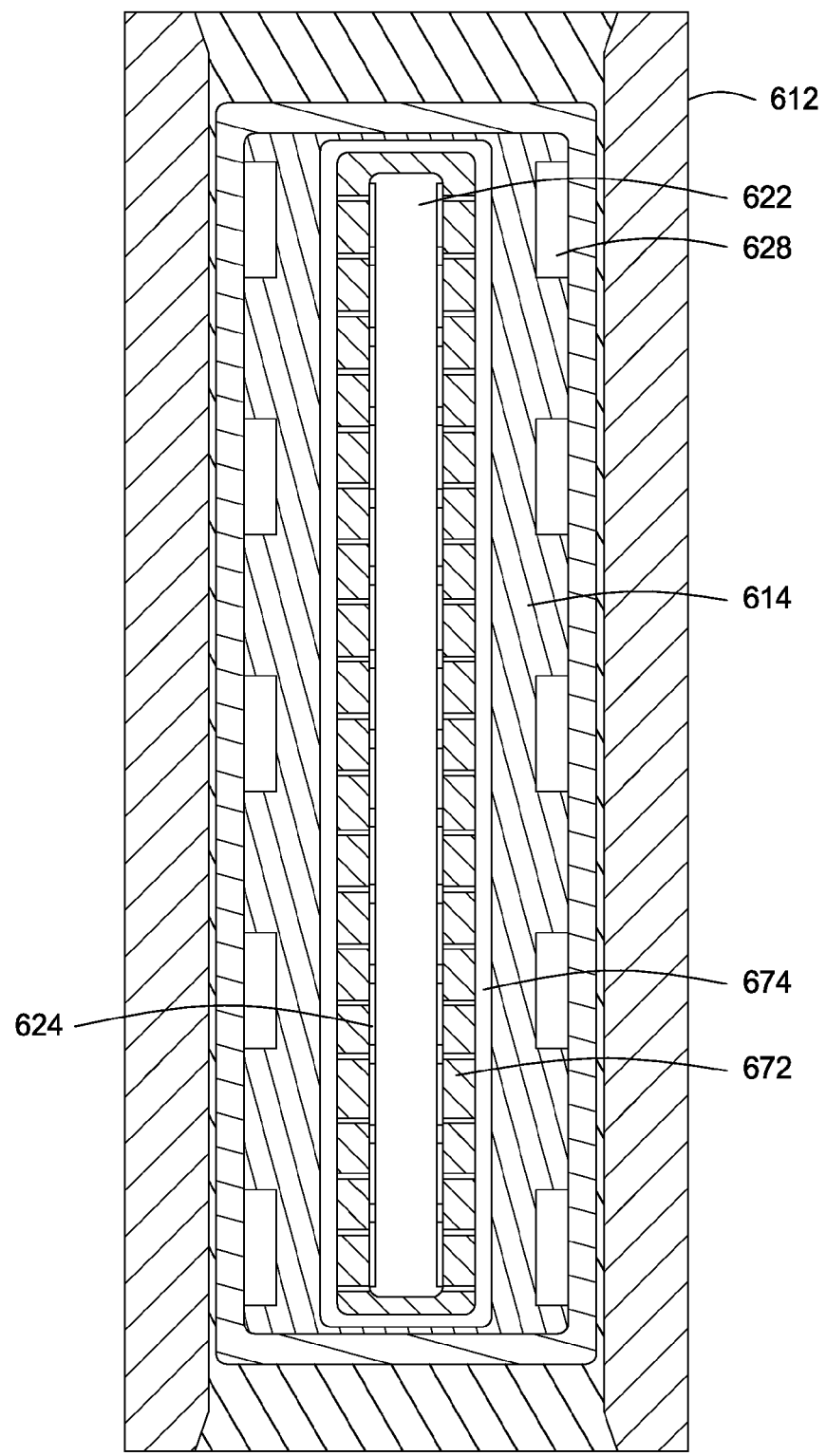
FIG. 6B is a schematic top view of a transport base of a substrate carrier in accordance with some embodiments of the present invention.
Figure 6C:
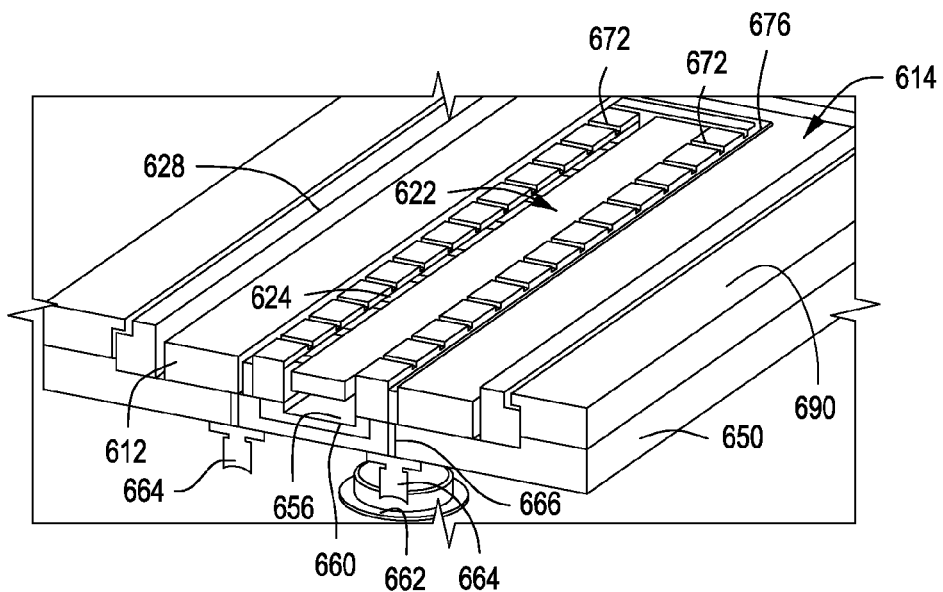
FIGS. 6C and 6D are isometric views of a transport base of a substrate carrier and base plate accordance with some embodiments of the present invention.
Figure 6D:
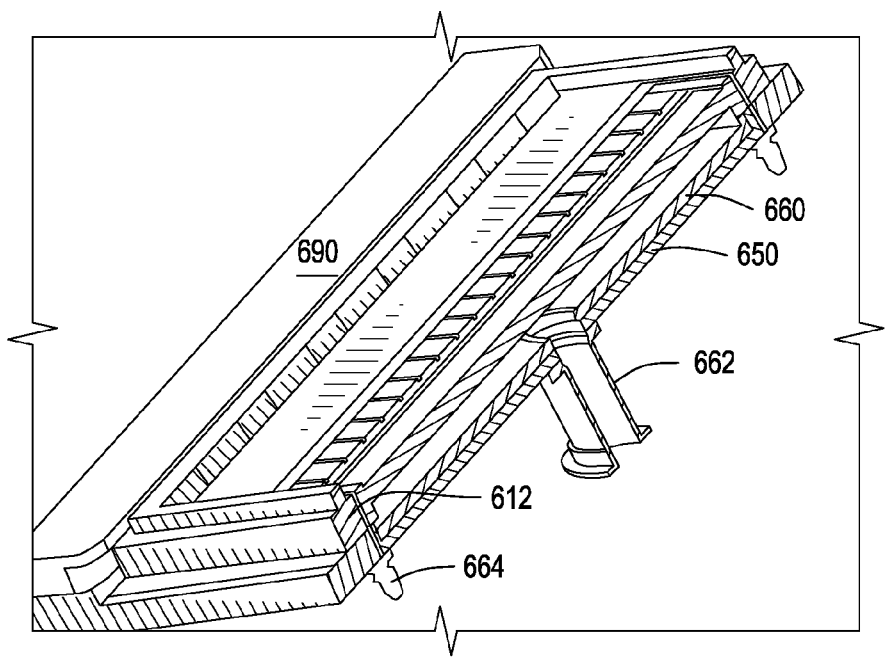

FIG. 6B depicts a top schematic view of transport base 612 that includes pocket 614, first gas channel 622, openings 624, purge gas exhaust conduits 628, cleaning gas supply slots 672, and inlets 674. FIGS. 6C and 6D are isometric views for the transport base 612 and base plate 650. Also shown in FIGS. 6C and 6D is substrate carrier guide 690 which helps keeps the substrate carrier 602 on base plate 650.

Figure 7A:
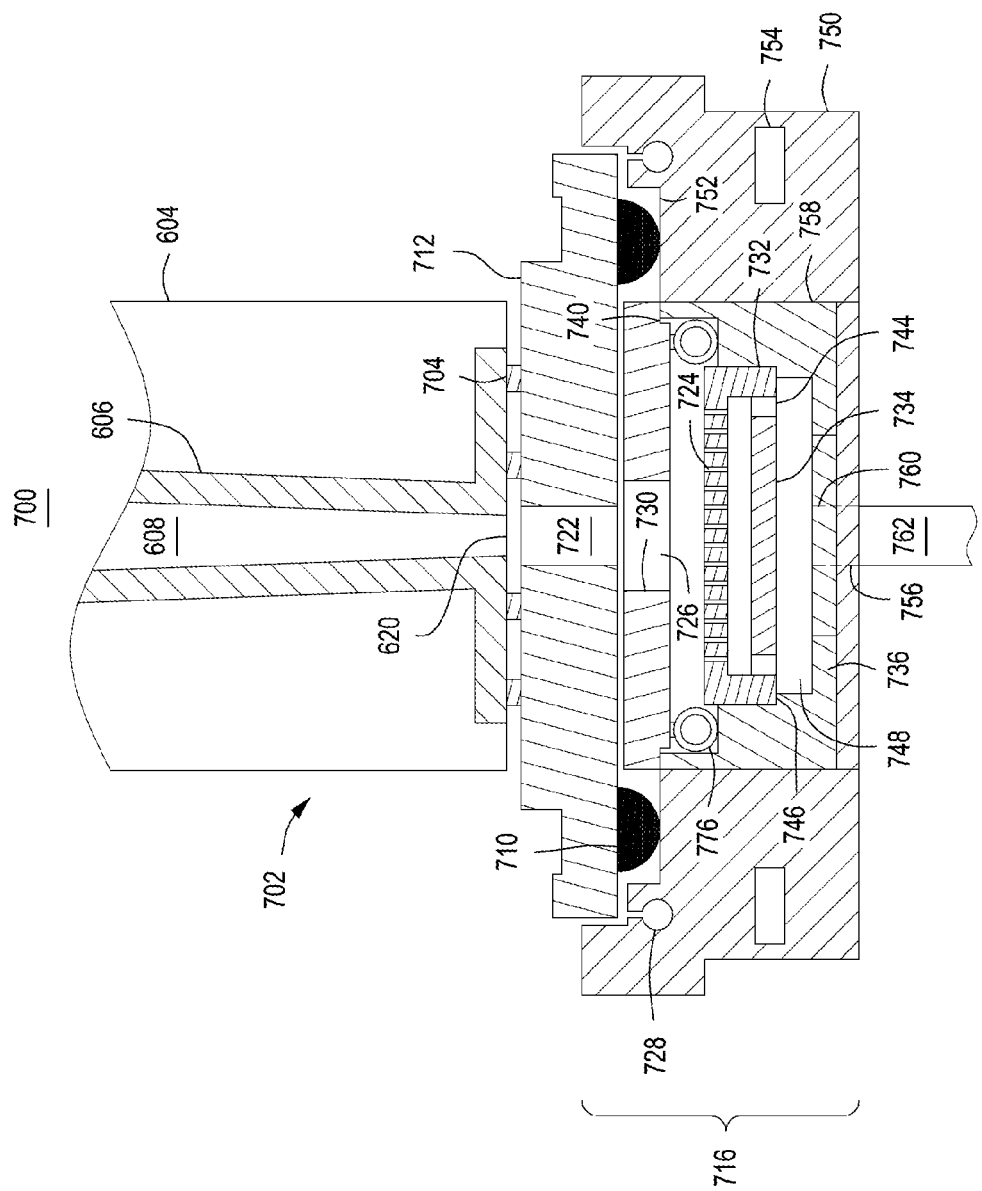
FIG. 7A is a schematic end view of a substrate carrier and exhaust system for use in a substrate processing tool in accordance with some embodiments of the present invention.
Figure 7B:
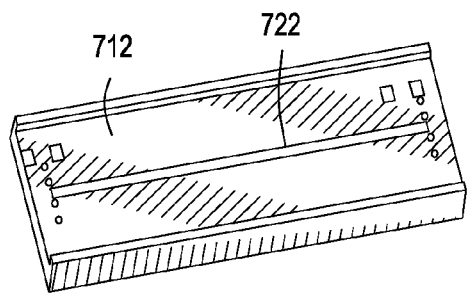
FIG. 7B is an isometric view of a transport base in accordance with some embodiments of the present invention.

FIG. 7A depicts another exemplary embodiment of an exhaust system 700 that may be used with embodiments of the present invention described herein. Some of the features/components described with respect to the embodiments of FIGS. 5 and 6A-6D may be used in conjunction with, or in place of the features described below.

In FIG. 7A, a movable substrate carrier 702 may be movably disposed on a base plate 750 (e.g., track 120 discussed above with respect to FIG. 1) to facilitate movement of one or more substrates through the indexed inline substrate processing tool 100 described in FIG. 1, or in and out of a standalone or cluster substrate processing tool. In some embodiments, the substrate carrier 702 may move along base plate 750 by sliding on low contact area bearing surfaces/features 710. In some embodiments, features 710 and/or a top surface 752 of base plate 750, may comprise a coating, for example, to facilitate movement of the substrate carrier 702 through, or into and out of, a processing tool, such as any of the similar coatings described above.

In some embodiments, the movable substrate carrier 702 may include a pair of substrate support plates 604 as described above with respect to FIG. 6A. In some embodiments, the substrate support plates 604 may be disposed on, and supported by, transport base 712. A plurality of supports 704 may be provided to raise the substrate support plates 604 above the transport base 712 to provide a channel for the purge gases provided to the module to be exhausted via a center exhaust slot 722, described below. In some embodiments, the substrate support plates 604 may be coupled to transport base 712 via fasteners or other suitable means. In some embodiments, the supports 704 may fit into slots in the base so no fasteners are required. The supports 704 may be fabricated from either the same material or alternate materials as the substrate support plates 604 depending on the thermal coupling required.

The transport base 712 includes a center exhaust slot 722 to facilitate the exhaust of one or more different types of gases. The center exhaust slot 722 fluidly couples a top surface of the transport base 712 to a bottom surface of the transport base 712. In some embodiments, the center exhaust slot 722 is formed along a centerline of transport base 712 as shown in the isometric view of FIG. 7B. The center exhaust slot 722 is fluidly coupled to the bottom exhaust slot 620 formed between substrate support plates 604. The center exhaust slot 722 accepts exhaust gases via the bottom exhaust slot 620 from the process gases injected (e.g., via gas inlet 208) between substrate support plates 604 to process substrates when disposed thereon. The exhaust gases received by center exhaust slot 722 via bottom exhaust slot 620 may travel through center exhaust slot 722 to an exhaust assembly 716. In some embodiments the base plate 750 may include one or more cooling channels 754 to facilitate heat removal. The one or more channels may be fluidly coupled to a coolant supply (not shown).

In some embodiments, the exhaust assembly may include one or more of a cover plate 730, a baffle plate 732, a deflector plate 734, an exhaust base 736 and the base plate 750. The cover plate 730, baffle plate 732, deflector plate 734, and exhaust base 736 may be disposed in a pocket formed in base plate 750.

Figure 7C:
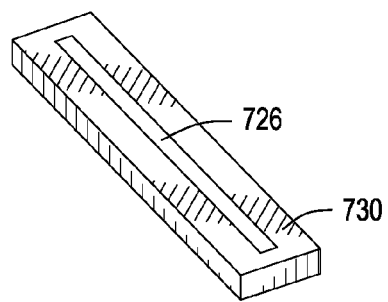
FIG. 7C is an isometric view of a cover plate in accordance with some embodiments of the present invention.

In some embodiments, the cover plate 730 may be disposed directly below a center portion of the transport base 712. The cover plate 730 may include a center exhaust slot 726 that substantially aligns with the center exhaust slot 722 of transport base 712. The cover plate 730 distributes the exhaust flow evenly to minimize channeling of the flow. The cover plate 730 may also decrease the probability of particles from the exhaust from backing up into the area between the substrates supports and reaching the substrates. FIG. 7C is an isometric view of the cover plate showing center exhaust slot 726. In some embodiments, a bottom surface of the cover plate 730 may be supported in exhaust assembly 716 by an upper surface of exhaust base 736. In some embodiments, the bottom surface of the cover plate 730 may also include a step feature 740 to help secure the cover plate 730.

Figure 7D:
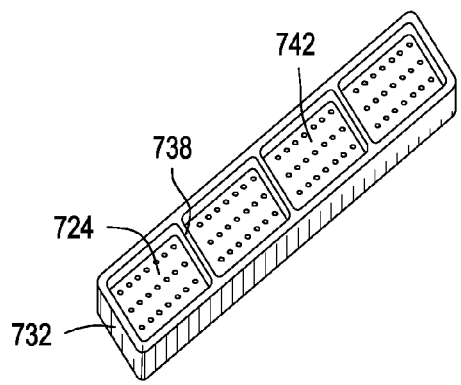
FIG. 7D is an isometric bottom view of a baffle plate in accordance with some embodiments of the present invention.

In some embodiments, the baffle plate 732 may be disposed directly below transport base 712 or may be disposed below cover plate 730 when present. The baffle plate include a plurality of exhaust holes 724 that extend through the body of the baffle plate 732 and that are configured to more uniformly pass the exhaust gases received from one or more of exhaust slots 722 and 726 to a lower portion of the exhaust assembly 716. In some embodiments, a bottom surface of the baffle plate may include one or more recesses 742 separated by support ridges 738 to provide for more uniform exhaust flow. FIG. 7D is an isometric bottom view of the baffle plate showing the exhaust holes 724 and the one or more recesses 742 separated by support ridges 738. In some embodiments, a bottom surface of the baffle plate 732 may be supported in exhaust assembly 716 by an upper surface of deflector plate 734. In some embodiments, the bottom surface of the cover plate 730 may also include a step feature 740.

Figure 7E:
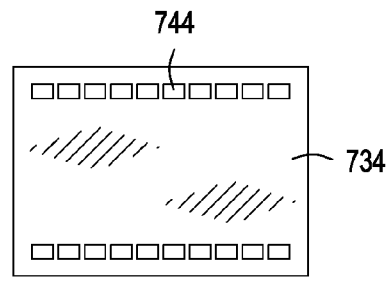
FIG. 7E is an isometric view of a deflector plate in accordance with some embodiments of the present invention.

In some embodiments, the deflector plate 734 may be disposed directly below the baffle plate 732, between the exhaust holes 724 of the baffle plate 732 and the exhaust port 762. The deflector plate 734 further distributes the pressure gradient of the exhaust assembly to provide for more uniform exhaust from the module during operation. The deflector plate 734 may include a plurality exhaust slots 744 disposed proximate the edges of the deflector plate 734 and formed along the length of the deflector plate 734. Exhaust slots 744 provide exhaust gases to gas channel 748 formed in a bottom portion of exhaust base 736. FIG. 7E is an isometric view of the deflector plate 734 showing exhaust slots 744. In some embodiments, a bottom surface of the deflector plate 734 may be supported in exhaust assembly 716 by a step feature 746 formed on exhaust base 736.

Figure 7F:
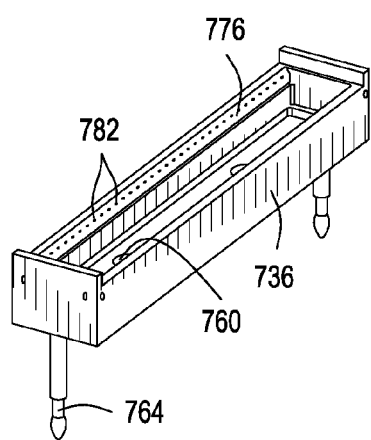
FIG. 7F is an isometric view of a exhaust base in accordance with some embodiments of the present invention.
Figure 7G:
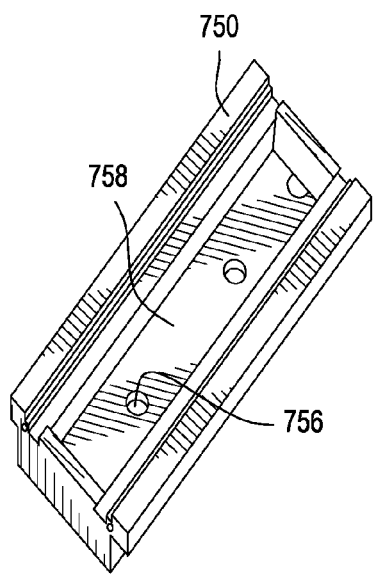
FIG. 7G is an isometric view of a base plate in accordance with some embodiments of the present invention.

In some embodiments, the exhaust base 736 may be disposed in a recess 758 of base plate 750. In some embodiments, the exhaust base 736 may include one or more exhaust conduits 760 that align with one or more exhaust conduits 756 in base plate 750. Exhaust gases may then leave exhaust assembly 716 via exhaust port 762. FIGS. 7F and 7G are isometric views of the exhaust base 736 and base plate 750, respectively showing exhaust conduits 760 and recess 758 of base plate 750.

Similar to embodiments discussed above with respect to FIG. 6A, in some embodiments, a cleaning gas may be provided to the exhaust system to facilitate removal of deposited material from the exhaust system. Specifically with respect to the embodiments of FIGS. 7A, and shown more clearly in isometric views of the exhaust base 736 in FIGS. 7F and 7H, one or more cleaning gases may be provided by cleaning gas supply ports 764 to one or more cleaning gas supply conduits 780 formed in the exhaust base 736. Cleaning gas supply conduits 780 may be formed on both ends of the exhaust base 736 to provide a more uniform distribution of cleaning gases to the exhaust system 700. The cleaning gas may be any gas suitable to remove a particular material from the module. For example, in some embodiments the cleaning gas may comprise one or more chlorine containing gases, such as hydrogen chloride (HCl), chlorine gas (Cl$_2$), or the like. Alternatively, in some embodiments, an inert gas may be provided to the cleaning gas supply conduit 780 to minimize deposition of material in any of the gas conduits (e.g. conduits, slots, openings and channels) described above, by forming a barrier between the exhaust gases flowing through the conduits and the surfaces of the conduits.

Figure 7H:
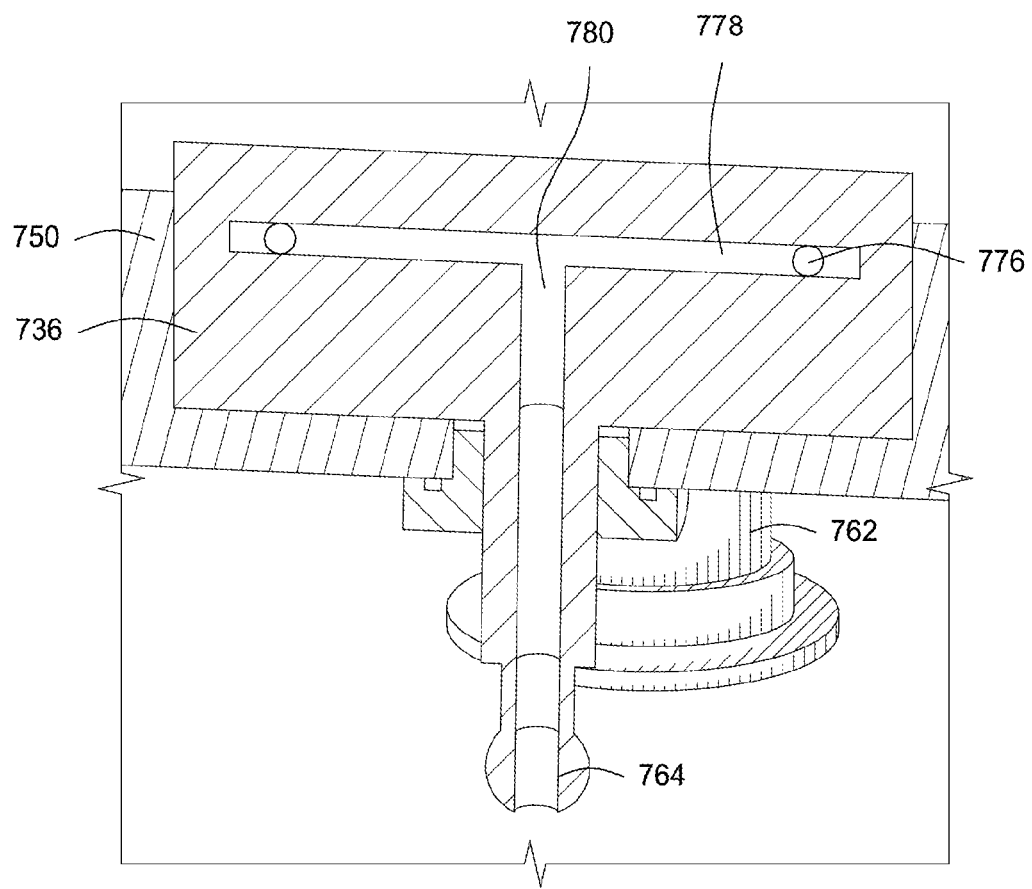
FIG. 7H is an isometric cross-sectional end view of a exhaust base in accordance with some embodiments of the present invention.

As shown in FIG. 7H, the cleaning gas supply conduit 780 is fluidly coupled to conduit 778 and then to cleaning gas conduits 776. As shown in FIGS. 7A and 7F, the cleaning gas conduits 776 may include a plurality of supply inlets 782 disposed along the lengths of the conduits 776 to provide the cleaning gas to an area above the baffle plate 732. Thus, the cleaning gas is exhausted via the same path as the process gases as described above (e.g., via exhaust holes 724, exhaust slots 744, exhaust conduits 760 and 756, and exhaust port 762).

In some embodiments, the transport base 712 includes one or more purge gas exhaust conduits 728 formed along the length of the transport base 712 and disposed proximate the outer edges of the transport base 712 on either side of the of the substrate support plates 604. The purge gas exhaust conduits 728 receive and exhaust the purge gases injected via gas inlet 208 to form the purge gas curtain discussed above. Each of the one or more purge gas exhaust conduits 728 are fluidly coupled to exhaust port 762 via one or more of exhaust holes 724, exhaust slots 744, exhaust conduits 760 and 756, and exhaust port 762. In other embodiments, purge gas exhaust conduits 728 vent to a separate "clean" exhaust located near each gate module door/gate for recovery and recycling (not shown).

The components of exhaust system 700 described above may be fabricated from any material suitable to support a substrate processing. For example, in some embodiments, any of the components described above may be SiC coated graphite, transparent (e.g., clear) or non-transparent (e.g., opaque)_quartz as desired based on heating or deposition profiles required for various processes. Stainless Steel coated with a dry lubricant suitable for use in high temperature substrate processing chambers may be used for other components.

In some embodiments, the cleaning gas supply ports 764 may be coupled to one or more mass flow controllers (e.g., mass flow controllers 680 described with respect to FIG. 6A) to provide cleaning gas to the exhaust system 700. The mass flow controllers may be coupled to a controller (e.g., controller 682 described with respect to FIG. 6A) to control the amount and concentration of the one or more cleaning gases supplied.

While the foregoing is directed to embodiments of the present invention, other and further embodiments of the invention may be devised without departing from the basic scope thereof.

The invention claimed is:

1. Apparatus for processing a substrate, comprising:
   a carrier for supporting one or more substrates in a substrate processing tool, the carrier having a first exhaust outlet; and
   an exhaust assembly comprising:
     a first inlet disposed proximate the carrier to receive process exhaust from the first exhaust outlet of the carrier;
     a second inlet to receive a cleaning gas; and
     an outlet, disposed below the first inlet, to remove the process exhaust and the cleaning gas.

2. The apparatus of claim 1, wherein the carrier is removably coupled to the exhaust assembly.

3. The apparatus of claim 1, wherein the carrier comprises a pair of angled supports that face each other to form a "v", wherein the first exhaust outlet is a slot disposed between the angled supports proximate a bottom of the "v".

4. The apparatus of claim 1, wherein the second inlet to receive a cleaning gas on the exhaust assembly is disposed on a bottom surface of the exhaust assembly.

5. Apparatus for processing a substrate, comprising:
   a carrier for supporting one or more substrates in a substrate processing tool, wherein the carrier comprises:
     a first exhaust outlet;
     a pair of substrate support plates coupled together and forming an exhaust slot along a bottom portion of the coupled support plates to facilitate the exhaust of substrate processing gases; and
     a transport base having a first pocket formed in an upper surface of the transport base, and a first exhaust channel formed within the first pocket, wherein the pair of substrate support plates is disposed in the first pocket, and wherein the first exhaust channel of the transport base is fluidly coupled to the exhaust slot formed between the pair of substrate support plates and the first exhaust outlet; and an exhaust assembly comprising:
     a first inlet disposed proximate the carrier to receive process exhaust from the first exhaust outlet of the carrier;
     a second inlet to receive a cleaning gas; and
     an outlet to remove the process exhaust and the cleaning gas.

6. The apparatus of claim 5, wherein the first exhaust channel of the transport base includes a plurality of exhaust openings formed along the length of the first exhaust channel and proximate the outer edges of the first exhaust channel.

7. The apparatus of claim 6, wherein the plurality of exhaust openings are fluidly coupled to a second gas channel formed on a bottom surface of the transport base, and wherein the second gas channel is fluidly coupled to the first exhaust outlet.

8. The apparatus of claim 7, wherein the exhaust assembly includes a first cleaning gas conduit coupled to the second inlet, wherein the transport base includes a second cleaning gas conduit that is fluidly coupled to the first cleaning gas conduit of the exhaust assembly, and wherein the second cleaning gas conduit of the transport base is fluidly coupled to the first exhaust channel of the transport base.

9. The apparatus of claim 8, wherein the second cleaning gas conduit of the transport base is fluidly coupled to the first exhaust channel of the transport base via a plurality of cleaning gas supply slots.

10. The apparatus of claim 1, wherein the cleaning gas is one or more chlorine containing gases.

11. The apparatus of claim 10, wherein the one or more chlorine containing gases includes at least one of hydrogen chloride (HCl) or chlorine gas ($Cl_2$).

12. The apparatus of claim 1, wherein the carrier includes a purge gas conduit proximate walls of a process chamber and configured to exhaust purge gases injected into the process chamber.

13. The apparatus of claim 12, wherein the purge gas conduit is fluidly coupled to the first exhaust outlet of the carrier.

14. The apparatus of claim 1, wherein the exhaust assembly includes a purge gas conduit configured to exhaust purge gases injected proximate walls of a process chamber.

15. The apparatus of claim 5, wherein the transport base is configured to slide across top surface of the exhaust assembly by sliding.

16. The apparatus of claim 5, wherein the transport base is movably coupled to the exhaust assembly, and wherein at least a portion of a bottom surface of the transport base is coated with a nickel alloy based lubricant to facilitate movement of the transport base along a top surface of the exhaust assembly.

17. The apparatus of claim 1, wherein the exhaust assembly comprises a base plate having a recess formed in a top surface therefore, and at least one of a cover plate, a baffle plate, a deflector plate or an exhaust plate disposed within the recess of the base plate.

18. The apparatus of claim 1, wherein the carrier comprises:
   a pair of substrate support plates facing each other and forming an exhaust slot along a bottom portion of the support plates to facilitate the exhaust of substrate processing gases; and
   a transport base having a center exhaust slot fluidly coupling a top surface of the transport base to a bottom surface of the transport base,
   wherein the pair of substrate support plates is disposed on a top surface of the transport base, and wherein the center exhaust slot of the transport base is fluidly coupled to the exhaust slot formed between the pair of substrate support plates.

19. The apparatus of claim 18, wherein the exhaust assembly includes a first cleaning gas conduit coupled to the second inlet, and wherein the first cleaning gas conduit includes a plurality of holes along a length of the first cleaning gas conduit to provide the cleaning gas to the exhaust assembly.

20. The apparatus of claim 1, wherein the exhaust assembly comprises a base plate having a recess formed in a top surface therefore, and at least one of a cover plate, a baffle plate, a deflector plate, or an exhaust plate disposed within the recess of the base plate to distribute a pressure gradient and provide more uniform exhaust during operation.

* * * * *